(12) United States Patent
Keyser

(10) Patent No.: US 8,973,260 B2
(45) Date of Patent: Mar. 10, 2015

(54) METHOD OF MAKING SELF-ALIGNED NANOTUBE CONTACT STRUCTURES

(75) Inventor: Thomas Keyser, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 979 days.

(21) Appl. No.: 12/369,372

(22) Filed: Feb. 11, 2009

(65) Prior Publication Data

US 2009/0293273 A1 Dec. 3, 2009

Related U.S. Application Data

(60) Provisional application No. 61/056,714, filed on May 28, 2008.

(51) Int. Cl.
| | | |
|---|---|---|
| H01R 9/00 | (2006.01) | |
| H05K 3/00 | (2006.01) | |
| H01R 43/00 | (2006.01) | |
| H01L 23/532 | (2006.01) | |
| B81C 1/00 | (2006.01) | |
| H01C 17/06 | (2006.01) | |
| H01L 21/768 | (2006.01) | |

(Continued)

(52) U.S. Cl.
CPC ...... *H01L 23/53276* (2013.01); *B81C 1/00095* (2013.01); *H01C 17/06* (2013.01); *H01L 21/76838* (2013.01); *H01L 23/5228* (2013.01); *H01L 27/0802* (2013.01); *H01L 2221/1094* (2013.01)
USPC .............................................. 29/842; 29/825

(58) Field of Classification Search
CPC .................... B81C 1/00095; H01L 21/76838; H01L 23/53276; H01C 17/06
USPC ..................................................... 29/842, 825
See application file for complete search history.

(56) References Cited

U.S. PATENT DOCUMENTS

| | | | | |
|---|---|---|---|---|
| 4,774,206 | A * | 9/1988 | Willer | 438/577 |
| 7,244,499 | B2 * | 7/2007 | Sugiyama et al. | 428/407 |
| 7,453,154 | B2 * | 11/2008 | Teo et al. | 257/777 |

(Continued)

FOREIGN PATENT DOCUMENTS

JP 2002-237497 8/2002

OTHER PUBLICATIONS

Oon, C. H., et. al., "Simple, Low-cost Technique for Photolithographic Self-Aligned Top Metal Contacts to Nanowires and Nanotubes," Nanotechnology, Oct. 8, 2008, vol. 19, pp. 1-6, IOP Publishing Ltd., United Kingdom.

(Continued)

*Primary Examiner* — David Angwin
(74) *Attorney, Agent, or Firm* — Shumaker & Sieffert, P.A.

(57) ABSTRACT

A method of forming nanotube contact structures may include forming an interconnect layer over a portion of a layer of a microelectronics device and forming a nanotube layer over a portion of the interconnect layer. The nanotube layer may define openings through the nanotube layer. The method also may include forming self-aligned electrodes in the openings of the nanotube layer such that the self-aligned electrodes are formed only in openings in the nanotube layer that substantially reside over metal filled vias of the microelectronics device. In some examples, the self-aligned electrodes may be formed on the metal in the vias, and the self-aligned electrodes may not be formed in openings that do not reside over the metal filled vias.

15 Claims, 7 Drawing Sheets

(51) Int. Cl.
*H01L 23/522* (2006.01)
*H01L 27/08* (2006.01)

(56) References Cited

U.S. PATENT DOCUMENTS

| | | | |
|---|---|---|---|
| 7,546,682 B2* | 6/2009 | Hsu et al. | 29/840 |
| 7,589,951 B2* | 9/2009 | Kunishi et al. | 361/306.3 |
| 2005/0067936 A1* | 3/2005 | Lee et al. | 313/309 |
| 2005/0148174 A1* | 7/2005 | Unger et al. | 438/678 |
| 2005/0215049 A1* | 9/2005 | Horibe et al. | 438/622 |
| 2006/0250856 A1* | 11/2006 | Bertin et al. | 365/189.01 |
| 2006/0264053 A1* | 11/2006 | Yates | 438/694 |
| 2006/0290343 A1* | 12/2006 | Crafts et al. | 324/158.1 |
| 2006/0292716 A1* | 12/2006 | Gu et al. | 438/20 |
| 2007/0071668 A1* | 3/2007 | Mouli et al. | 423/447.3 |
| 2007/0155158 A1* | 7/2007 | Gstrein et al. | 438/618 |
| 2007/0277373 A1* | 12/2007 | Takai et al. | 29/829 |
| 2008/0012047 A1* | 1/2008 | Bertin et al. | 257/213 |
| 2008/0129278 A1* | 6/2008 | Dai et al. | 324/109 |
| 2009/0293273 A1* | 12/2009 | Keyser | 29/874 |

OTHER PUBLICATIONS

Lee, S. -B., et. al., "Suspended Multiwalled Carbon Nanotubes as Self-aligned Evaporation Masks," Journal of Nanoscience and Nanotechnology, 2003, vol. 3, No. 4, pp. 325-328, American Scientific Publishers.

European Search Report from corresponding EP Application No. 09160883, mailed Jul. 27, 2010, 3 pages.

* cited by examiner

Pattern vias through dielectric layer

Deposit metal and polish off dielectric surface

Form nanotube layer over interconnect layer

Form self-aligned electrodes on nanotube layer by selective electroless plating or chemical vapor deposition

_US 8,973,260 B2_

METHOD OF MAKING SELF-ALIGNED NANOTUBE CONTACT STRUCTURES

CROSS-REFERENCE TO RELATED APPLICATION

The present patent application claims priority under 35 U.S.C. §119(e) to U.S. Provisional Patent Application Ser. No. 61/056,714, filed on May 28, 2008, the entire contents of which are incorporated herein by reference as if fully set forth in this description.

FIELD

The present application relates to methods of making nanotube contact structures, and more particularly, to methods of making nanotube contact structures with low resistance.

BACKGROUND

Nanotubes and nanotube-derived films are implemented in a variety of electronic and sensing devices. Many of these devices require application of a voltage potential across individual, bundles, or networks of nanotubes. Therefore, an electrical contact is included in the device to provide the voltage across the nanotube. The ability to form stable, low resistance electrical contacts to the nanotube structures helps to enable reliable operation of these devices.

One example of electrical contacts coupled to nanotube structures includes preformed bottom contacts. Bottom contacts may be sensitive to electrode surface preparation and topography effects, typically offer limited surface contact area, and may only provide a relatively high contact resistance, and thus generally lack desirable characteristics for use with nanotube structures.

Another example of electrical contacts coupled to nanotube structures includes top side contacts formed by conventional deposition and patterning techniques. But top side contacts are also generally not applicable to nanotube structures because the top side contact metals may not be able to be etched with sufficient selectivity to avoid degrading the thin nanostructures located below. In addition, procedures for forming top side contacts, such as using lift-off techniques for example, are generally not compatible with state-of-the-art nanotube devices and manufacturing methods.

SUMMARY

Disclosed herein are embodiments of a method for forming nanotube contact structures. The method includes embedding base contacts in a layer of a microelectronics device and forming a nanotube layer over the base contacts such that openings remain in the nanotube layer. The nanotube layer provides a conductive medium between the base contacts. In other examples, the nanotube layer is present as a resistive or semi-conductive layer. The method also includes forming self-aligned electrodes on the nanotube layer substantially over the base contacts by selective deposition. The self-aligned electrodes substantially fill only the openings in the nanotube layer that substantially reside over the base contacts.

In another embodiment, the method includes forming an interconnect layer over a portion of a layer of a microelectronics device, forming a nanotube layer over a portion of the interconnect layer, such that openings remain in the nanotube layer, and forming self-aligned electrodes in the openings of the nanotube layer. The self-aligned electrodes substantially fill only the openings in the nanotube layer that substantially reside over metal filled vias of the microelectronics device.

In still another embodiment, the method includes forming an interconnect layer over a first layer of a microelectronics device, forming a second layer of the microelectronics device over the interconnect layer, and patterning one or more vias through the second layer. The method also includes substantially filling the vias with a metal, forming a nanotube layer onto a surface of the second layer, such that openings remain in the nanotube layer, and forming self-aligned electrodes substantially over the nanotube layer. The self-aligned electrodes substantially fill only the openings in the nanotube layer that substantially reside over the metal in the vias.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
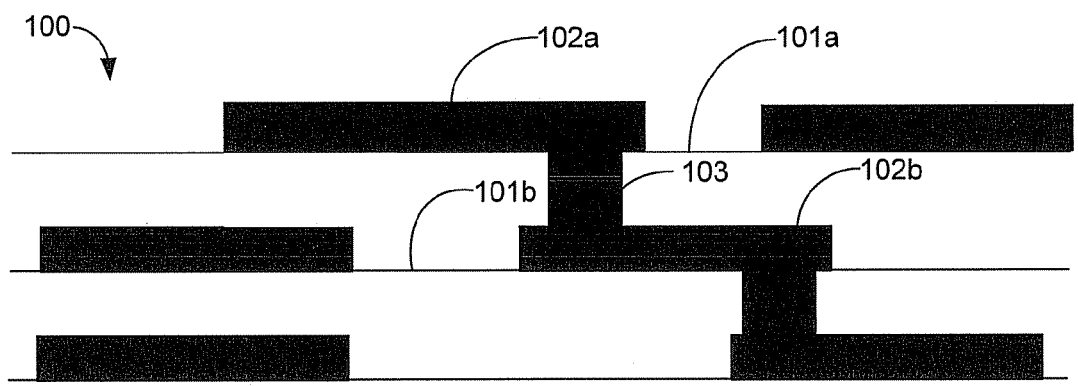
FIG. 1 is an example conceptual structural diagram showing an interconnect system.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

In embodiments disclosed below, a nanotube contact structure may be formed by selectively depositing a film over nanotubes or through a nanotube network onto an interconnect layer located below. The nanotube contact structure may be self-aligned such that the nanotube contact structure envelops or encloses individual nanotubes in a region or predefined region and provides contacts with low resistance and high yield and uniformity. The self-aligned nanotube contact structure may also eliminate patterning steps and facilitate strong attachments of the nanotubes to the interconnect layer surface.

FIG. 1 shows an interconnect system 100. The interconnect system 100 may include one or more layers 101*a* and 101*b* (which may be dielectric layers or other substrate materials) and one or more interconnect layers 102*a* and 102*b*. The interconnect layers 102*a* and 102*b* may include circuitry and form electrical interconnections between each other through a filled via 103. Examples of circuits using comparable interconnect systems include non-volatile random access memories and application-specific integrated circuits (ASIC).

The interconnect system 100 may require electrical contacts to couple interconnect layers or to connect to other circuitry. In one embodiment, self-aligned nanotube contact structures are provided.

Figure 2A:
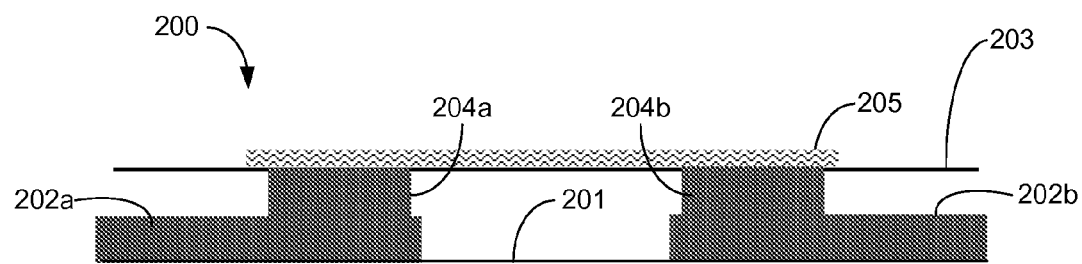
FIGS. 2A-2B are example conceptual structural diagrams showing formation of nanotube contact structures.
Figure 2B:
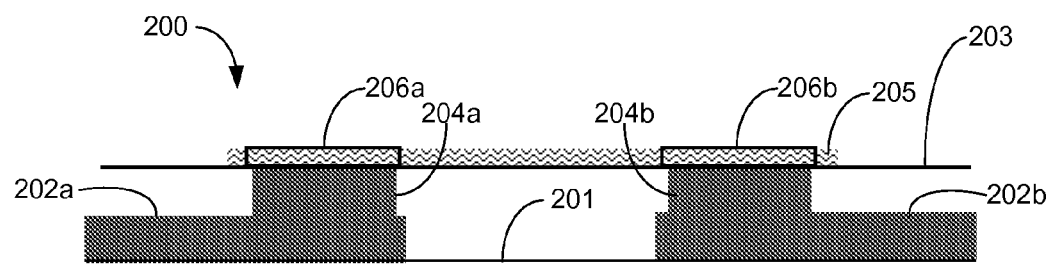

FIGS. 2A-2B are example conceptual structural diagrams showing formation of a self-aligned nanotube contact structure 200. FIG. 2A shows a self-aligned nanotube contact structure 200, which may include a first layer 201, interconnect layers 202a and 202b, and a second layer 203. The interconnect layers 202a and 202b may be formed on the first layer 201. The first layer 201 may be a dielectric, such as silicon dioxide or silicon nitride. The second layer 203 may be formed on the interconnect layers 202a and 202b. The second layer 203 may be a dielectric, such as silicon dioxide or silicon nitride. The nanotube contact structure 200 also includes base contacts 204a and 204b, which may be formed on a surface of the second layer 203 or be embedded in the second layer 203 by using deposition and chemical-mechanical polishing techniques. The self-aligned nanotube contact structure 200 may be formed by constructing base contacts 204a and 204b that provide an electrical interconnection to the interconnect layers 202a and 202b located below.

A nanotube layer 205 may be formed on the second layer 203 using individual mechanical or electrical nanotube placement, chemical vapor deposition, spin-on application of nanotube suspensions, or other methods. The nanotube layer 205 may be an individual nanotube or a network of individual nanotubes. Openings may remain in the nanotube layer between individual nanotubes. The nanotube layer 205 may include a carbon nanotube (CNT) fabric film, such as a solution or a suspension of carbon nanotubes. In addition, inorganic nanotubes, graphene structures, and carbon nanotubes doped with nitrogen, boron, or silicon could be used, for example. The nanotube layer 205 may then be patterned to form electronic or sensing elements using conventional 5 masking and etching techniques. The nanotube layer 205 may create a resistor element, which conducts current between two or more of the base contacts 204a and 204b. The resistance of the nanotube layer 205 can be altered or programmed by the application of voltage and current. In other example embodiments, the nanotube layer 205 could be present as a resistive or semi-conductive layer.

FIG. 2B shows self-aligned metal contacts 206a and 206b, which can be formed by selectively depositing a thin film over the nanotube layer 205. For example, the self-aligned metal contacts 206a and 206b may be formed by selective chemical vapor deposition (CVD) using tungsten, electroplating copper, or another conductive material or electroless plating metal like nickel or palladium.

One example of electroless plating is electroless nickel plating, an autocatalytic reduction-oxidation reaction that requires no external source of current. Electroless plating can be implemented using a preliminary activation step performed before the nanotube layer 205 is deposited to enable selective deposition on the surface of a variety of materials. For example, a palladium chloride solution can be used first to activate a surface of the base contacts 204a and 204b. Next, a solution containing a reducing agent and ions of the metal to be plated, such as nickel, is applied to the surface to be plated. At the interface between the catalytic surface (the surface of the base contacts 204a and 204b) and the solution, the nickel ions are reduced, such that they gain electrons and are plated onto the surface of the base contacts 204a and 204b as a coating of solid nickel, resulting in the self-aligned metal contacts 206a and 206b. Because the reaction only occurs at the interface between the solution and the catalytic surface or only occurs substantially at this interface, nickel is only substantially deposited onto the surface of the base contacts 204a and 204b.

Figure 3:
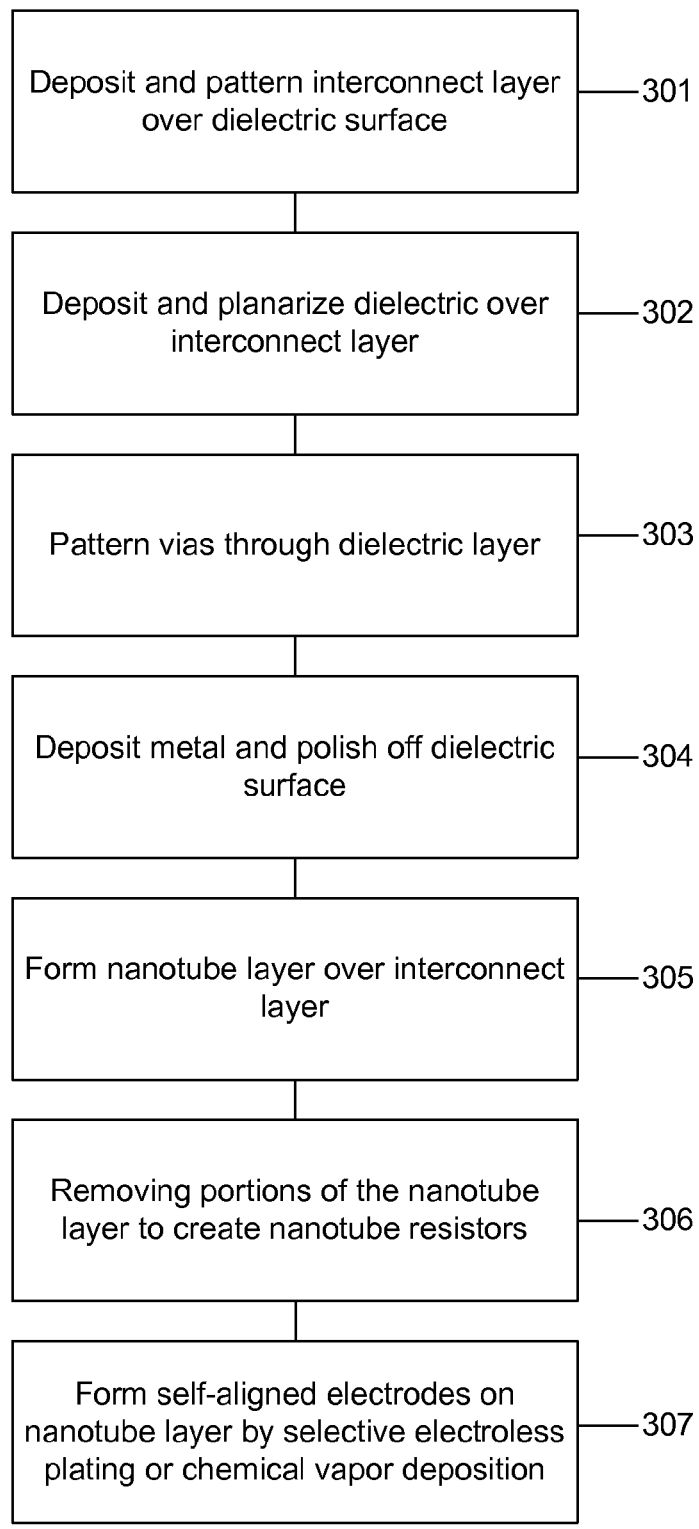
FIG. 3 is flowchart including examples of functional steps for forming nanotube contact structures.

FIG. 3 illustrates a flowchart of steps detailing an example method for forming nanotube contact structures. As shown in block 301, initially, an interconnect layer is deposited and patterned over a nonconducting or dielectric surface. For example, a metal layer could be deposited across a silicon oxide layer and patterned into a set of leads using masking and etching techniques.

Next, as shown in block 302, a layer of dielectric material is deposited and planarized over the interconnect layer. For example, a second silicon oxide layer could be deposited over the patterned leads of the metal interconnect layer and the resulting raised portions of the silicon oxide layer can be polished off to form a planar dielectric surface.

As shown in block 303, vias are then patterned through the dielectric layer that was deposited and planarized in block 302. For example, a chemical-mechanical polishing step can be performed such that vias are formed in the second silicon oxide layer. The vias are openings through the second dielectric layer to the interconnect layer.

Then, as shown in block 304, a metal, such as tungsten, is deposited onto the dielectric surface containing the vias. Then the metal is polished off the dielectric surface such that the metal remains only in the vias. Additional optional steps may include the deposition of a thin layer of another metal, such as titanium, over the vias, followed by the deposition of another thin layer, such as titanium nitride, over this layer, resulting in three-layer metal vias.

The interconnect layer is now ready for application of a nanotube layer. As shown in block 305, a nanotube layer is formed over the metal vias, such that openings remain in the nanotube layer. For example, a carbon nanotube (CNT) fabric film, such as a solution or a suspension of carbon nanotubes, can be applied to the dielectric surface with the metal vias. The CNT film layer can be thin (20 nm or less). In addition to carbon nanotubes, inorganic nanotubes, graphene structures, and carbon nanotubes doped with nitrogen, boron, or silicon could be used.

As shown in block 306, portions of the nanotube layer can be removed to create nanotube resistors. Nanotube resistors can be defined in the nanotube layer using a resistor mask, such as a photoresist, aligned with the metal vias below. Nanotubes unprotected by the resistor mask can be etched off using oxygen plasma, resulting in holes in the nanotube layer, and the resistor mask can be removed with a solvent. For example, portions of the nanotube layer could be etched away or removed to leave rectangular-shaped regions of nanotube layer that serve as resistors.

The final step, as shown in block 307, is to form self-aligned electrodes on the nanotube layer by selective deposition. The self-aligned electrodes may be metal, such as nickel, palladium, cobalt, or gold. For example, a metal could be deposited onto the nanotubes by selective electroless plating or selective chemical vapor deposition such that the metal envelops the individual nanotubes and self-aligned electrodes form through the openings in the nanotube layer. In an example embodiment, electroless nickel plating is used to form the self-aligned electrodes by depositing nickel over the nanotube layer created in block 305 and the metal-filled vias created in block 304. Because the deposition process requires the presence of a metal surface, the self-aligned electrodes form only over the metal-filled vias. In one example, a palladium chloride solution may be used first to activate the surface, then a commercially prepared solution of nickel sulfate, amine borane or borohydride, and ammonium hydroxide may be deposited over the nanotube layer. Heat treatment can be used to drive off liquids (or to stabilize the nickel deposit), resulting in self-aligned electrodes, which envelop each individual nanotube.

Figure 4A:
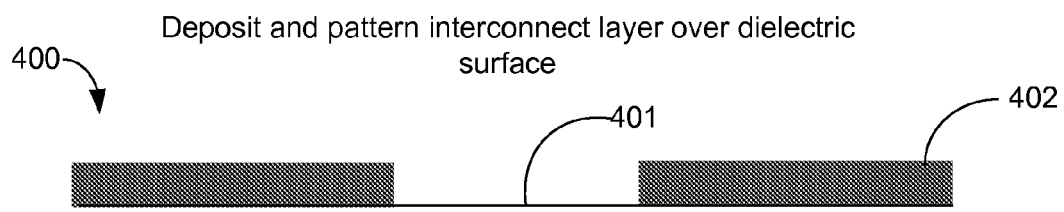
FIGS. 4A-4F are additional example conceptual structural diagrams showing formation of nanotube contact structures.

FIGS. 4A-4F are example conceptual structural diagrams showing formation of a self-aligned nanotube contact structure 400. FIG. 4A shows a first layer 401 and an interconnect layer 402. The first layer 401 may be a dielectric, such as silicon dioxide or silicon nitride. The interconnect layer 402 may be deposited and patterned over the first layer 401. For example, the interconnect layer may be a pattern of metal leads that form an interconnection with surrounding metal interconnect layers.

Figure 4B:
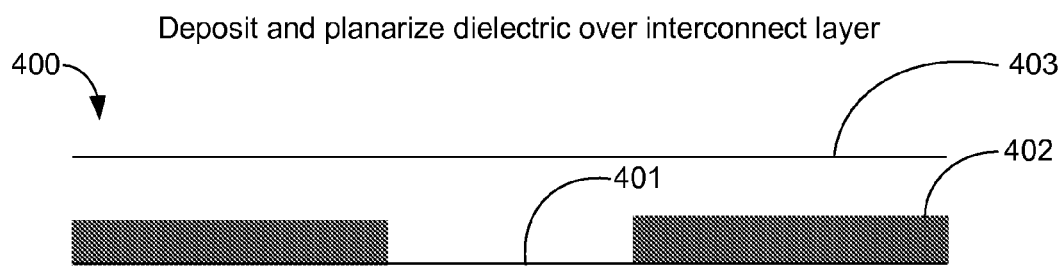
Figure 4C:
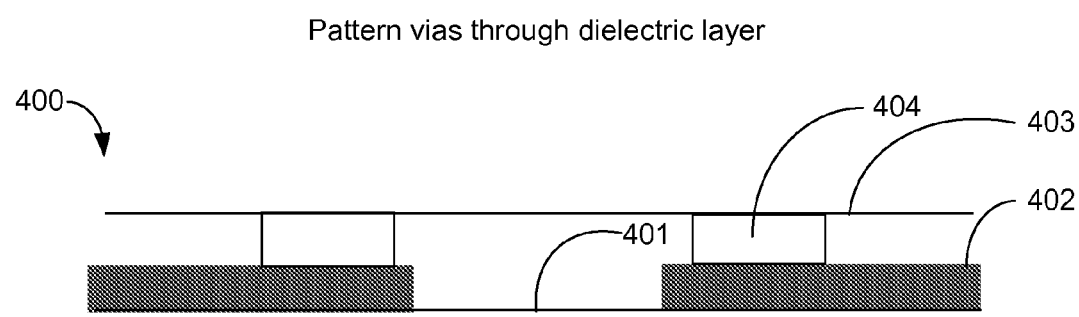

FIG. 4B shows a second layer 403, which may be deposited and planarized over the interconnect layer 402. In one example, both the first layer 401 and the second layer 403 may be dielectric materials, such as silicon dioxide or silicone nitride. FIG. 4C shows a via 404, which may be patterned through the second layer 403. One or more vias 404 may be patterned through the second layer 403.

Figure 4D:
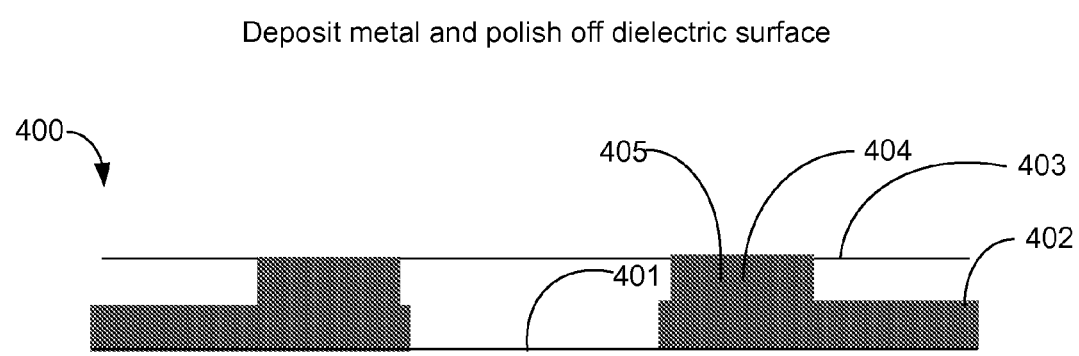

FIG. 4D shows a filled via 405. The filled via 405 may be formed by depositing a metal, such as tungsten, for example, on the second layer 403 and within an opening generated by the via 404, and polishing the second layer 403 such that metal only remains in the via 404 or only remains substantially in the via 404 and possibly a nearby surrounding region.

Figure 4E:
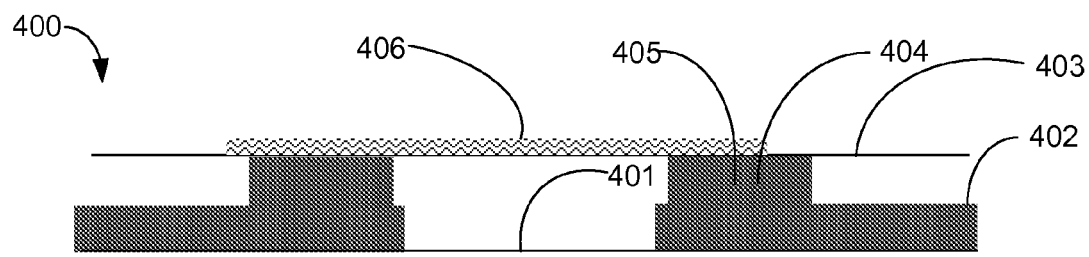
Figure 5:
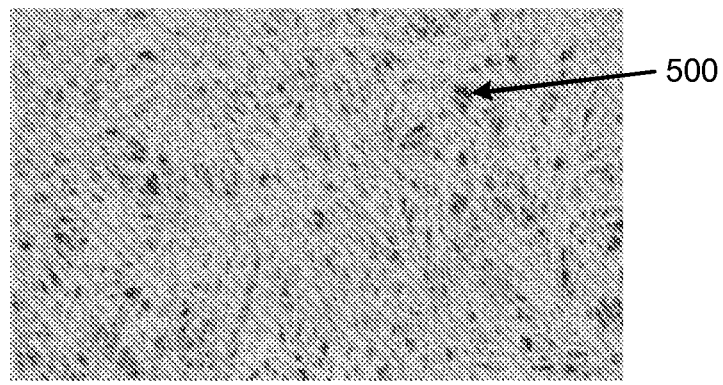
FIG. 5 is an example electron micrograph illustration of a nanotube layer.

FIG. 4E shows a nanotube layer 406, which can be formed over the second layer 403, the filled via 405, and the interconnect layer 402. The nanotube layer 406 may be formed such that openings remain in the nanotube layer. For example, nanotubes may be bonded or merged together such that linking occurs between the nanotubes in any type of pattern. As one example, FIG. 5 illustrates an example electron micrograph image of one nanotube layer. Dark images, such as 500, are openings within the nanotube layer and illustrate a substrate below the nanotube layer. Other types of patterning of nanotubes may be used as well.

The nanotube layer 406 may comprise carbon nanotubes and fabric structures formed from carbon nanotubes, for example. The nanotube layer 406 may comprise other types of nanotubes as well. For example, the nanotube layer could comprise inorganic nanotubes, graphene structures, or carbon nanotubes doped with nitrogen, boron, or silicon. The nanotube layer 406 may or may not cover the entire filled via 405.

Figure 4F:
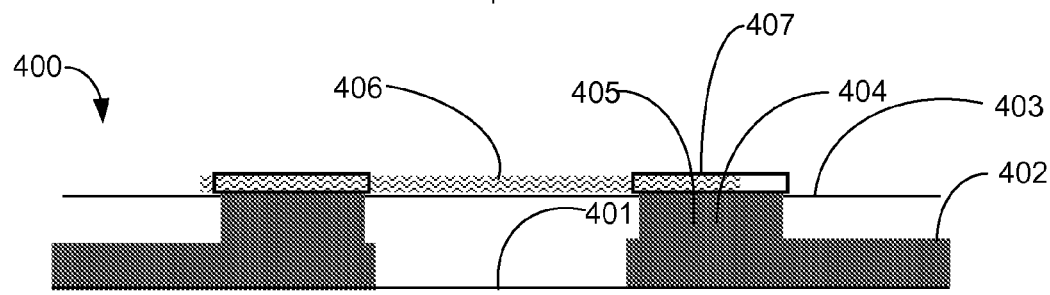

FIG. 4F shows a self-aligned electrode 407, which may be formed by selective deposition over the nanotube layer 406. For example, the selective deposition may be performed by electroless plating or chemical vapor deposition, and the self-aligned electrode 407 may form only over the metal in the filled via 405. The self-aligned electrode 407 may be a metal electrode, such as nickel, palladium, cobalt, or gold.

One example of electroless plating is electroless nickel plating, an autocatalytic reduction-oxidation reaction that requires no external source of current. Electroless plating can be implemented using a preliminary activation step performed before the nanotube layer 406 is deposited to enable selective deposition on the surface of a variety of materials. For example, a palladium chloride solution can be used first to activate a surface of the metal via 405 in order to remove unwanted particles. Next, a solution containing a reducing agent and ions of the metal to be plated, such as nickel, is applied to the surface to be plated. At the interface between the catalytic surface (the surface of the metal via 405) and the solution, the nickel ions are reduced, such that they gain electrons and are plated onto the surface of the metal via 405 as a coating of solid nickel, resulting in the self-aligned electrode 407. Because the reaction only occurs at the interface between the solution and the catalytic surface, nickel is deposited only onto the surface of the metal via 405.

It should be understood that the steps described herein are for purposes of example only. As such, those skilled in the art will appreciate that other steps and other materials can be used instead, and some steps may be omitted altogether according to the desired results. It is intended that the foregoing detailed description be regarded as illustrative rather than limiting, and it is intended to be understood that the following claims including all equivalents define the scope of the application.

The invention claimed is:

1. A method of forming nanotube contact structures, the method comprising:
   forming an interconnect layer over a portion of a layer of a microelectronics device;
   forming a nanotube layer over a portion of the interconnect layer, wherein the nanotube layer defines openings through the nanotube layer; and
   forming self-aligned electrodes in the openings of the nanotube layer such that the self-aligned electrodes are formed only in openings in the nanotube layer that substantially reside over metal filled vias of the microelectronics device, wherein the self-aligned electrodes are formed on the metal in the vias, and the self-aligned electrodes are not formed in openings that do not reside over the metal filled vias.

2. The method of claim 1, further comprising:
   forming a second layer of the microelectronics device over a portion of the interconnect layer;
   patterning one or more vias through the second layer; and
   substantially filling the vias with a metal.

3. The method of claim 2, wherein the second layer comprises a dielectric layer.

4. The method of claim 3, wherein the dielectric layer is silicon dioxide.

5. The method of claim 3, wherein the dielectric layer is silicon nitride.

6. The method of claim 1, wherein the nanotube layer comprises carbon nanotubes.

7. The method of claim 1, wherein the self-aligned electrodes are metal.

8. The method of claim 1, wherein the self-aligned electrodes are plated onto the metal in the vias by a reduction-oxidation reaction.

9. The method of claim 1, wherein the self-aligned electrodes are formed on the nanotube layer by selective electroless plating.

10. The method of claim 1, wherein the self-aligned electrodes are formed by selective chemical vapor deposition.

11. The method of claim 2, further comprising activating a surface of the metal that filled the vias to remove particles.

12. The method of claim 2, further comprising applying a reducing agent of the metal to the surface of the metal.

13. The method of claim 12, wherein forming the self-aligned electrodes in the openings of the nanotube layer comprises plating nickel onto the metal in the vias using a reduction-oxidation reaction.

14. The method of claim 13, wherein the reduction-oxidation reaction occurs through the openings in the nanotube layer and only substantially at an interface including the reducing agent and the surface of the metal.

15. The method of claim 2, further comprising removing portions of the nanotube layer to create nanotube resistors.

* * * * *